US005418505A

United States Patent [19]

Agarwal et al.

[11] Patent Number: 5,418,505

[45] Date of Patent: May 23, 1995

[54] COAX-TO-MICROSTRIP TRANSITION

[75] Inventors: Krishna K. Agarwal, Plano; Richard R. Harlan, Wylie, both of Tex.

[73] Assignee: E-Systems, Inc., Dallas, Tex.

[21] Appl. No.: 95,542

[22] Filed: Jul. 26, 1993

[51] Int. Cl.$^{6}$ .................. H03H 7/38

[52] U.S. Cl. .................. 333/33; 333/34; 333/246

[58] Field of Search .................. 333/33, 246, 260, 34

[56] References Cited

U.S. PATENT DOCUMENTS

| | | | |
|---|---|---|---|
| 3,757,272 | 9/1973 | Laramec et al. | 333/260 |
| 4,656,441 | 4/1987 | Takahashi et al. | 333/33 |
| 4,951,011 | 8/1990 | Heckaman et al. | 333/33 |

FOREIGN PATENT DOCUMENTS

| | | |
|---|---|---|
| 0124955 | 9/1979 | Japan . |
| 0000101 | 1/1985 | Japan . |
| 0006902 | 1/1991 | Japan . |
| 0101149 | 4/1991 | Japan . |

*Primary Examiner*—Robert J. Pascal
*Assistant Examiner*—Darius Gambino
*Attorney, Agent, or Firm*—Harold E. Meier

[57] ABSTRACT

A coaxial-to-microstrip transition compensated to reduce the impedance discontinuity and parasitic inductance of the transition. The impedance discontinuity is reduced by decreasing the inductance due to the center conductor pin of the coaxial line and the inductance due to the bond wire connecting the center conductor pin to the microstrip line. The impedance discontinuity is also reduced by increasing the capacitance from the microstrip line to ground and from the microstrip line to the center conductor pin of the coaxial line. To reduce the inductance in the signal conduction path, a small diameter center conductor pin is used. A short length of bond wire, doubled around the center conductor is used to connect the center conductor pin to the microstrip line. Also, a thin dielectric substrate is used to minimize the length of the center conductor pin that extends beyond the base of the coaxial housing. The capacitance is increased by flaring the end of the microstrip line near the connection with the center conductor pin and partially extending the dielectric substrate over the opening in the coaxial line housing around the center conductor pin.

15 Claims, 1 Drawing Sheet

COAX-TO-MICROSTRIP TRANSITION

TECHNICAL FIELD

The present invention relates to a coaxial-to-microstrip transition, and more specifically to a right-angle coaxial-to-microstrip transition having a low impedance discontinuity and a low parasitic inductance at the transition.

BACKGROUND OF THE INVENTION

Transitions from a microstrip transmission line to a coaxial line have become common structures in microwave and high frequency systems. These transitions, however, particularly very sharp or right-angle transitions, can be problematic because microwave and high frequency energy prefers to travel in a straight path. When the microstrip or coaxial transmission line has a bend or impedance discontinuity, undesirable energy reflection and radiation takes place. These reflections degrade the signal by effectively reducing the transfer of energy from the signal source to the receiving circuit. Prior art techniques used to minimize these reflections in very sharp and right-angle transitions have included impedance matching and gradual field transitions.

The primary source of the impedance discontinuity in a right-angle coaxial-to-microstrip transition is the parasitic inductance in the signal conduction path and the ground path. The signal conduction path inductance is due to the position of the center conductor pin of the coaxial line above the floor of the coaxial line housing necessary to make the connection to the microstrip line. The signal conduction path inductance is also caused by the length of bond wire necessary to connect the microstrip line to the center conductor pin of the coaxial line. The ground path inductance of a right-angle coaxial-to-microstrip transition is caused by the distance between the end of the ground path of the microstrip line and the end of the ground path of the coaxial line.

Thus a need has arisen for a right-angle coaxial-to-microstrip transition that more effectively reduces the impedance discontinuity and parasitic inductance of the transition. The improved transition should result in a low insertion loss and low reflection loss at the transition operating over a very wide frequency band.

SUMMARY OF THE INVENTION

The present invention overcomes the foregoing and other problems associated with the prior art by reducing the impedance discontinuity and parasitic inductance of the transition. The right-angle coaxial-to-microstrip transition of the present invention effectively reduces the inductance in both the signal conduction path and the ground path. By controlling the length of the center conductor pin of the coaxial line such that it is flush to the thickness of the dielectric substrate, the inductance due to the position of the center conductor pin above the base of the coaxial line housing is reduced. Also, signal conduction path inductance is reduced by connecting the microstrip line to the center conductor pin of the coaxial line with a short length of bond wire doubled around the center conductor pin. In order to minimize inductance in the ground path, the outer conductor shield of the coaxial line and the ground line of the microstrip line are connected together at the same point.

The right-angle coaxial-to-microstrip transition of the present invention also reduces the impedance discontinuity of the transition by increasing the open end capacitance from the microstrip line to ground and from the microstrip line to the center conductor pin of the coaxial line. This increased capacitance serves to offset any residual inductance in the signal conduction path. To increase the open end capacitance, the microstrip line is flared at the point of connection to the center conductor pin of the coaxial line. The open end capacitance is further increased by extending the dielectric substrate over an opening in the coaxial line housing around the center conductor pin of the coaxial line.

The reductions in inductance in the signal conduction path and the ground path and the increases in open end capacitance result in a right angle coaxial-to-microstrip transition with a low insertion loss and a low reflection loss operating over a very wide frequency band. The performance of the right angle coaxial-to-microstrip broadband transition of the present invention has been shown to operate over a range from DC to 20 GHz with less than 0.5 dB insertion loss and better than 20 dB return loss.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION OF THE DRAWINGS

Figure 1:
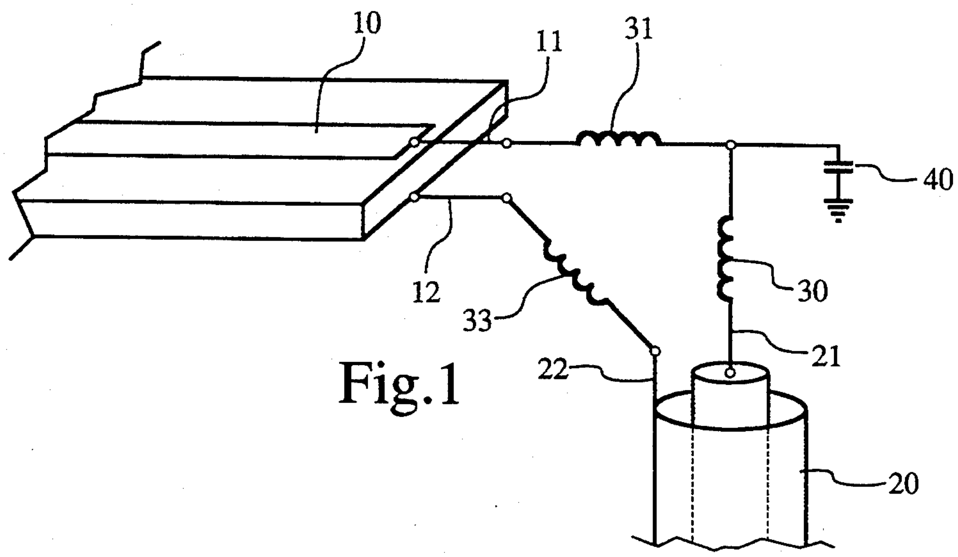
FIG. 1 is an illustration of an equivalent circuit for an uncompensated right-angle coaxial-to-microstrip broadband transition.

Referring now to FIG. 1, there is shown an illustration of an equivalent circuit for an uncompensated right-angle coaxial-to-microstrip transition. A standard right-angle coaxial-to-microstrip transition as found in the prior art generally consists of a center conductor pin of a coaxial line 20 connected through a bond wire to a microstrip line 10 running along the top surface of a dielectric substrate. The coaxial line 20 consists of a center conductor pin 21 for signal conduction and a ground conductor shield 22 for ground. The microstrip line 10 consists of a microstrip signal line 11 running along the top surface of the dielectric substrate and a ground line 12 running along the bottom surface of the dielectric substrate. The mechanical and physical characteristics of the uncompensated right-angle coaxial-to-microstrip transition of the prior art results in an impedance discontinuity and parasitic inductance in the signal conduction path and the ground path. The signal conduction path inductance is due to both the pin inductance 30 and the wire inductance 31. The pin inductance 30 is a function of the position of the center conductor pin 21 of the coaxial line 20 above the end of the ground conductor shield 22 of the coaxial line and the coaxial line housing. The wire inductance 31 is a function of the length of the bond wire needed to connect the center conductor pin 21 of the coaxial line 20 to the microstrip signal line 11. The ground path inductance 33 is primarily caused by the location of and the distance between the end of the ground line 12 of the microstrip line 10 and the end of the ground conductor shield 22 of the coaxial line 20. The prior art right-angle coaxial-to-microstrip transition also generates a negligible stray capacitance 40 from the signal conduction path to ground due to radiation and coupling to the coaxial line housing walls.

Figure 2:
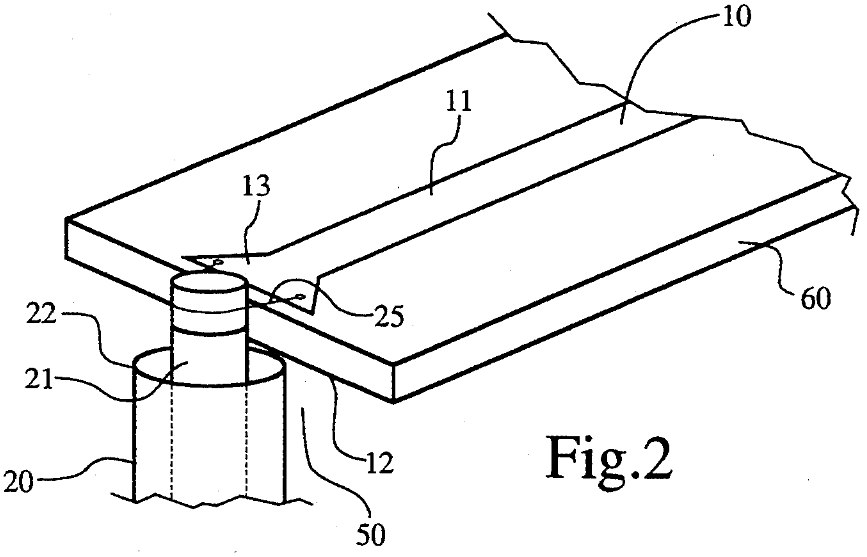
FIG. 2 is a perspective view of the right-angle coaxial-to-microstrip broadband transition of the present invention.

Referring to FIG. 2, there is shown a perspective view of the compensated right-angle coaxial-to-microstrip transition of the present invention. As an initial matter, the impedance of the coaxial line 20 and the microstrip line 10 are matched as closely as possible at fifty Ohms. The impedance discontinuity and parasitic inductance which remains in the transition is minimized through a number of improvements to the structure of the transition. The reductions in both the signal path inductance and the ground path inductance and the increases in the open end capacitance result in a right-angle coaxial-to-microstrip transition having a low insertion loss and low reflection loss operation over a very wide frequency band.

The signal path inductance is minimized by minimizing both the pin inductance and the wire inductance. The pin inductance is reduced by minimizing the length of the center conductor pin 21 above the end of the ground conductor shield 22 and the base of the coaxial line housing 50. This is accomplished by means of a thin dielectric substrate 60 to minimize the separation of the microstrip signal line 11 from the base of the coaxial line housing 50 such that only a small length of center conductor pin is needed to make the connection to the microstrip line. The wire inductance is minimized by using a small diameter center conductor pin 21 such that only a small length of bond wire 25 is needed to span the distance from the end of the microstrip signal line 11 to the center conductor pin and to wrap around the center conductor pin. Also, by doubling the bond wire 25 around the center conductor pin 21 and connecting both ends of the bond wire to the microstrip signal line 11, the wire inductance is reduced by half. Doubling the bond wire 25 around the center conductor pin 21 also has the added advantage of ensuring that a redundant and secure connection is made between the microstrip signal line 11 and the center conductor pin 21. To reduce the inductance in the ground path, the transition is configured such that the location of the end of the ground line 12 of the microstrip line 10 and the end of the ground conductor shield 22 of the coaxial line 20 are connected and thus constitute a single point.

The right-angle coaxial-to-microstrip transition of the present invention also reduces the impedance discontinuity at the transition by increasing the compensating open end capacitance from the microstrip signal line 11 to ground and from the microstrip signal line to the center conductor pin 21 of the coaxial line 20. In an uncompensated right-angle coaxial-to-microstrip transition, the capacitance from the microstrip signal line 11 to ground is due to radiation and coupling to the walls of the coaxial line housing 50. Because there is no need for the walls of the coaxial line housing 50 to be located in close proximity to the transition, the capacitance from the microstrip signal line 11 to ground due to radiation is usually quite low in an uncompensated transition. If the capacitance from the microstrip signal line 11 to ground and from the microstrip signal line to the center conductor pin 21 of the coaxial line 20 was increased, the residual inductance in the signal conduction path would be offset and further reduced. In the compensated transition of the present invention, the capacitance is increased by using a flared microstrip signal line 13 near the connection with the center conductor pin 21 of the coaxial line 20. Also, by using a flared microstrip signal line 13 near the connection with the center conductor pin 21, the length of the bond wire 25 is reduced because the distance from the microstrip signal line 11 to the center conductor pin is slightly reduced. Because the length of the bond wire 25 is shortened, the wire inductance along the signal conduction path is reduced. Another improvement in the compensated transition of the present invention which further increases the capacitance is the extension of the dielectric substrate 60 over the opening in the coaxial line housing 50 where the center conductor pin 21 extends through the base of the coaxial line housing. The microstrip signal line 11 extends along the upper surface of the dielectric substrate 60 over the opening in the coaxial line housing 50, but the ground line 12 stops at the point where it is connected to the ground conductor shield 22 of the coaxial line 20. This extension of the dielectric substrate 60 increases the capacitance from the microstrip signal line 11 to ground as well as from the microstrip signal line 11 to the center conductor pin 21 of the coaxial line 20. By increasing the compensating open end capacitance at the transition, the signal path inductance due to the wire inductance and the pin inductance is offset.

Figure 3:
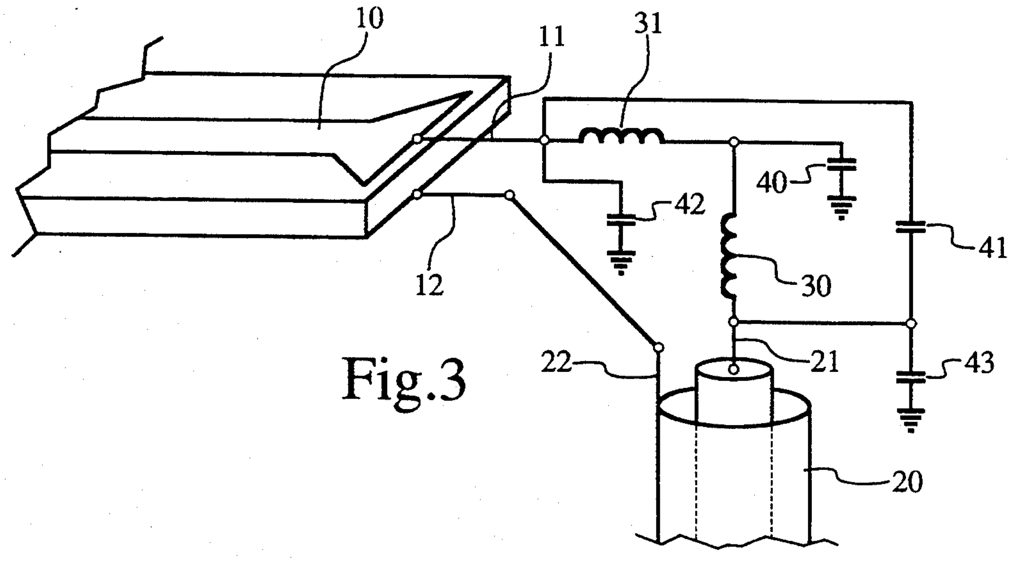
FIG. 3 is an illustration of an equivalent circuit for a compensated right-angle coaxial-to-microstrip transition.

Referring to FIG. 3, there is shown an equivalent circuit of the compensated coaxial-to-microstrip transition of the present invention. The ground path inductance present in the uncompensated right-angle coaxial-to-microstrip transition has been corrected in the compensated transition by connecting at a single point the end of the ground line 12 of the microstrip line 10 and the end of the ground conductor shield 22 of the coaxial line 20. The open end capacitance 42 from the signal conduction path to ground has been increased due to the flared microstrip signal line 11. The extension of the dielectric substrate over the opening in the coaxial line housing where the center conductor pin 21 of the coaxial line 20 extends through the coaxial line housing increases the stray capacitance 40, and the open end capacitance 43, of the coaxial line. Also, an open end capacitance 41 from the microstrip signal line 11 to the center conductor pin 21 of the coaxial line 20 is created in the compensated transition that is in parallel with the wire inductance 31 and pin inductance 30. This capacitance is also due to the flared microstrip signal line 11 and the extension of the dielectric substrate over the opening in the coaxial line housing where the center conductor pin 21 of the coaxial line 20 extends through the coaxial line housing. The open end capacitance from the signal conduction path to ground and from the microstrip signal line 11 to the center conductor pin 21 of the coaxial line 20 shunts and thus further reduces the signal conduction path inductance due to the wire inductance 31 and the pin inductance 30. The net result is a good approximation of a continuous, fifty Ohm transmission line.

Although a preferred embodiment of the invention has been illustrated in the accompanying Drawings and described in the foregoing Detailed Description, it will be understood that the invention is not limited to the embodiment disclosed but is capable of numerous rearrangements and modifications of parts and elements without departing from the scope of the invention.

We claim:

1. A coaxial-to-microstrip transition, comprising:
a coaxial line having a center conductor extending beyond an end of a ground conductor shield of said coaxial line;
a microstrip line positioned on a dielectric substrate including a microstrip signal line on a top surface of said dielectric substrate and a microstrip ground line on a bottom surface of said dielectric substrate; and
a bond wire having a first end electrically connected to an end of said microstrip signal line and a second end at least partially wrapped around an outer surface of and electrically connected to said center conductor.

2. The coaxial-to-microstrip transition of claim 1 wherein the ground line terminates prior to an end of said dielectric substrate, and the end of the dielectric substrate partially extends over an area of said coaxial line between the ground conducting shield and said center conductor.

3. The coaxial-to-microstrip transition of claim 1 wherein said center conductor has a minimum diameter selected to reduce the length of said bond wire partially wrapped around the center conductor.

4. The coaxial-to-microstrip transition of claim 1 wherein the second end of said bond wire further extends from being partially wrapped around said center conductor and is electrically connected to the end of said microstrip signal line.

5. The coaxial-to-microstrip transition of claim 1 wherein the microstrip ground line ends at substantially the same point as, and is in electrical contact with the end of said ground conductor shield of said coaxial line.

6. The coaxial-to-microstrip transition of claim 1 wherein said dielectric substrate comprises a relatively thin cross-section thickness to minimize the length of said center conductor pin that extends beyond the the end of said ground conductor shield of said coaxial line.

7. A coaxial-to-microstrip transition, comprising:
a coaxial line having a center conductor extending beyond an end of a ground conductor shield of said coaxial line;
a microstrip line positioned on a dielectric substrate including a microstrip signal line and a microstrip ground line;
said microstrip ground line electrically contacting the ground conductor shield; and
a bond wire wrapped partially around the center conductor connecting said microstrip signal line to said center conductor.

8. The coaxial-to-microstrip transition of claim 7 wherein the microstrip signal line has a flared end proximate to the connection with said center conductor of said coaxial line.

9. The coaxial-to-microstrip transition of claim 7 wherein the ground line ends at the ground conductor shield.

10. A transition between a coaxial line and a microstrip line, comprising:
an electrical connection between the coaxial line having a center conductor and the microstrip line having a signal line; and
means for decreasing an inductance in the electrical connection between the microstrip line and the coaxial line comprising a bond wire connected to the signal line and wrapped partially around the center conductor.

11. A method for controlling the impedance discontinuity in a transition between a coaxial line having a ground conductor shield and a microstrip line having a ground path comprising the steps of:
connecting a center conductor pin of the coaxial line to the microstrip line;
flaring said microstrip line near the connection with the center conductor pin of the coaxial line;
terminating an end of the ground path of the microstrip line at the end of the ground conductor shield of the coaxial line; and
extending a dielectric substrate that supports the microstrip line to a position between the ground conductor shield and said center conductor pin.

12. The method for controlling the impedance discontinuity in the transition of claim 11 wherein the step of connecting further includes the step of partially wrapping the bond wire around the center conductor pin.

13. The method for controlling the impedance discontinuity in the transition of claim 11 including the step of minimizing the length said center conductor pin extends beyond the ground conductor shield of said coaxial line.

14. The transition as in claim 10 wherein the means for decreasing the inductance comprises:
a bond wire electrically connected at one end to a signal line of the microstrip line and a second end at least partially wrapped around an outer surface of a center conductor of the coaxial line; and
said center conductor having a small diameter to reduce the length of the bond wire partially wrapped around the center conductor.

15. The transition as in claim 10 further including means for increasing the capacitance in the electrical connection comprising:
a flaring of the width of the signal line of said microstrip line near the electrical connection with the center conductor of the coaxial line; and
a dielectric substrate for the microstrip line separating the signal line and a ground line, wherein an end of said dielectric substrate is positioned between an outer conductor and the center conductor of the coaxial line.

* * * * *